United States Patent [19]

Koike et al.

[11] 4,268,845
[45] May 19, 1981

[54] SOLID-STATE IMAGING DEVICE

[75] Inventors: Norio Koike, Tokyo; Shoji Hanamura, Kokubunji; Masaharu Kubo, Hachioji, all of Japan

[73] Assignee: Hitachi, Ltd., Tokyo, Japan

[21] Appl. No.: 96,683

[22] Filed: Nov. 23, 1979

[30] Foreign Application Priority Data

Dec. 1, 1978 [JP] Japan ................................ 53/147871

[51] Int. Cl.³ .............................................. H01L 27/14
[52] U.S. Cl. ....................................... 357/30; 357/23; 357/31; 307/304; 307/311
[58] Field of Search ............................ 357/31, 30, 23; 307/304, 311

[56] References Cited

U.S. PATENT DOCUMENTS

| 4,143,389 | 3/1979 | Koike | 357/31 |
| 4,148,501 | 4/1979 | Koike | 357/30 |
| 4,189,749 | 2/1980 | Hiroshima | 358/167 |
| 4,209,806 | 7/1980 | Koike | 358/123 |

*Primary Examiner*—Martin H. Edlow
*Attorney, Agent, or Firm*—Craig & Antonelli

[57] ABSTRACT

A solid-state imaging device of a picture element construction made up of photodiodes consisting of an N-type semiconductor substrate, a P-type well region formed in the main surface of said semiconductor substrate, and an N-type region formed in said well region, and vertical switching insulated-gate field effect transistors which utilize said N-type region as either the source or the drain, characterized in that a video voltage is applied to said substrate.

6 Claims, 3 Drawing Figures

SOLID-STATE IMAGING DEVICE

BACKGROUND OF THE INVENTION

(1) Field of the Invention

The present invention relates to a solid-state imaging device in which photoelectric conversion elements and scanning circuits are integrated on the same semiconductor substrate. More specifically, the invention relates to a solid-state imaging device having improved driving format.

(2) Description of the Prior Art

A solid-state imaging device used for a TV broadcasting camera must have a resolving power comparable with that of image pickup tubes which are currently being used for the TV broadcast. Therefore, it is necessary to provide about 500×500 units of photoelectric conversion elements, horizontal switching elements and vertical switching elements for selecting the photoelectric conversion elements, about 500 stages of horizontal scanning circuits and about 500 stages of vertical scanning circuits for turning on the horizontal and vertical switching elements. Hence, the device is usually constructed based upon the MOS LSI technology which permits high integration to be relatively easily materialized. FIG. 1 is a diagram schematically illustrating the above-mentioned solid-state imaging device, in which reference numeral 10 denotes a matrix of photoelectric conversion elements, 11 denotes horizontal scanning circuits for selecting X-positions in the matrix, and 12 denotes vertical scanning circuits for selecting Y-positions in the matrix. Reference numeral 13 denotes vertical switching insulated-gate field effect transistors (hereinafter referred to as MOST's) which turn on and off by the vertical scanning pulses from the circuits 12, 14 denotes photodiodes utilizing the source junction of MOST's 13, and 15 denotes vertical signal output lines commonly connecting the drains of MOST's 13. Reference numeral 16 denotes horizontal switching MOST's which turn on and off by the horizontal scanning pulses from the horizontal scanning circuits, and of which the drains are connected to a horizontal signal output line 17 and the sources are connected to vertical signal output lines 15. Reference numeral 18 denotes a driving voltage source (voltage source for video output) for driving photodiodes, which is connected to the horizontal signal output line 17 via a resistor 19, and 20 denotes a signal output terminal. Referring to FIG. 1, the device is constructed using p-channel MOST's. The device can, of course, be constructed using n-channel MOST's if the polarity of voltage is reversed. The horizontal and vertical scanning circuits turn on the switching MOST's 16 and 13 one by one, such that a photocurrent from the photodiodes that are arrayed in a two-dimensional manner is read out through the resistor 19. The signals from the photodiodes correspond to optical images projected thereonto, whereby it is allowed to take out video signals depending upon the above-mentioned operation. The feature of the solid-state imaging device of this type is that the sources of switching MOST's can be utilized for the photoelectric conversion, and that MOST shift registers can be utilized for the scanning circuits.

Usually, therefore, the solid-state imaging device of this type can be relatively easily integrated to a high degree based upon the MOS LSI technology as illustrated by a picture element of FIG. 2. In FIG. 2, reference numeral 21 denotes a semiconductor substrate of N-type conductivity for integrating the photoelectric conversion elements and scanning circuits, and 22 denotes a well region of a semiconductor region of P-type conductivity formed on the semiconductor substrate of N-type conductivity. Reference numeral 13 denotes a vertical switching MOST having a gate electrode 25 which will be turned on and off by the vertical scanning circuit 12, and 26 denotes a source of the MOST 13 which consists of a high impurity concentration region of N-type conductivity and which constitutes a photodiode 14 utilizing the junction with respect to the P-type well. Reference numeral 27 denotes a drain of the MOST 13 consisting of a high impurity concentration region of N-type conductivity, which is connected to a conductive layer 28 that serves as a vertical signal output line 15. One end of the output line 28 (15) to which are commonly connected the drains of a plurality of switching MOST's, is connected to a horizontal switching MOST 16 which will be turned on and off by an output 29 of the horizontal scanning circuit 11, and the other end of the switching MOST 16 is connected to the horizontal signal output line 17. The well 22 and the substrate 21 are usually maintained at the ground voltage (0 volt). Reference numerals 31, 32 and 33 denote insulating films which are usually composed of an $SiO_2$ film.

The photodiode charged to a video voltage Vv by the scanning undergoes the discharge ($\Delta$Vv) responsive to the amount of light incident during a one-frame period. Then, as the switching MOST's 13, 16 are rendered conductive by the next scanning, charging current is allowed to flow to supplement the amount lost by the discharge. The charging current is read out through the resistor 19 connected to the voltage source 18 for video output, whereby a video signal is obtained at an output terminal 20.

The solid-state imaging device of the picture element construction illustrated in FIG. 2 has the P-type well region and a photoelectric conversion element in the well region, making it possible to prevent the development of blooming. Further, the infrared rays are almost all absorbed in the substrate, without causing the resolution to be deteriorated. Moreover, the spectral response in visible light is flattened making it possible to obtain image signals faithful to the subject, thus presenting various advantages. This device has the most excellent characteristics among the imaging devices proposed and developed thus far.

However, since 250,000 units of picture elements are integrated on the monolithic substrate, and the whole size is greater by 4 to 8 times than the size of the semiconductor memory, a great difficulty is involved in the manufacture of the device. With the solid-state imaging device of this type, therefore, several tens of white spots or white vertical lines appear on the reproduced image, to deteriorate the quality of the image. The inventors of the present invention examined the causes for developing defects using the imaging device having picture elements illustrated in FIG. 2, and found the fact that these defects much depend upon the voltage (hereinafter referred to as $V_{SUB}$) applied to the substrate 21, and white defects develop when the substrate voltage $V_{SUB}$ is smaller than the video voltage Vv. It was also found that when the voltage $V_{SUB}$ is greater than the voltage Vv, black lines vertically appear in the reproduced image (in the example of FIG. 2, since $V_{SUB}=0$ volt, Vv is greater than $V_{SUB}$ so that white defects develop).

The white defects are caused by the N-type region of the substrate which is short-circuited to the N-type region of the photodiode through a non-diffused region 34 in the well region. The short-circuited state is developed by bad diffusion which is caused by the dust or the like during the step of fabricating the well region. The vertical black lines are likewise developed by the short-circuited state between the N-type region and the N+-type drain. This short-circuited state is also caused by the non-diffused region 35 which is attributed to the infiltration of dust and dirt during the step of fabricating the well region. The non-diffused regions 34, 35 are formed by the dust and dirt which adhere on the surface of the semiconductor substrate; matter masking diffusion which is not subjected to the etching is left, preventing the P-type impurities from being diffused into the semiconductor substrate. It is impossible to completely prevent the introduction of the defects. Even when a well-controlled dust-less equipment is used, several defects develop per square centimeter. Since the imaging device has an area of 1 $cm^2$ or less, at least several white spots or black vertical lines develop due to the defects, making it very difficult to materialize the imaging device which presents image of good quality. In addition to the above-mentioned defects, there may also develop black spots which, however, are less visible by human eyes provided their diameters are not so large. The black spots therefore less affect the picture quality. Consequently, white spots and black lines present problem in reproducing the images using the solid-state imaging device.

SUMMARY OF THE INVENTION

The object of the present invention is to prevent the development of white spots and black lines that are main causes for deteriorating the image quality of the solid-state imaging device.

In other words, the object of the present invention is to provide a solid-state imaging device which does not develop white spots or black lines on the reproduced image.

The solid-state imaging device of the present invention has a picture element construction as illustrated in FIG. 2, in which a video voltage is applied to the photodiodes as well as to the substrate, in order that white sports are converted into black spots that are less visible to the eye and that the development of black lines is prevented.

DETAILED DESCRIPTION OF THE PREFERRED EMBODIMENTS

The present invention will now be described in detail with reference to the following embodiment.

Figure 3:
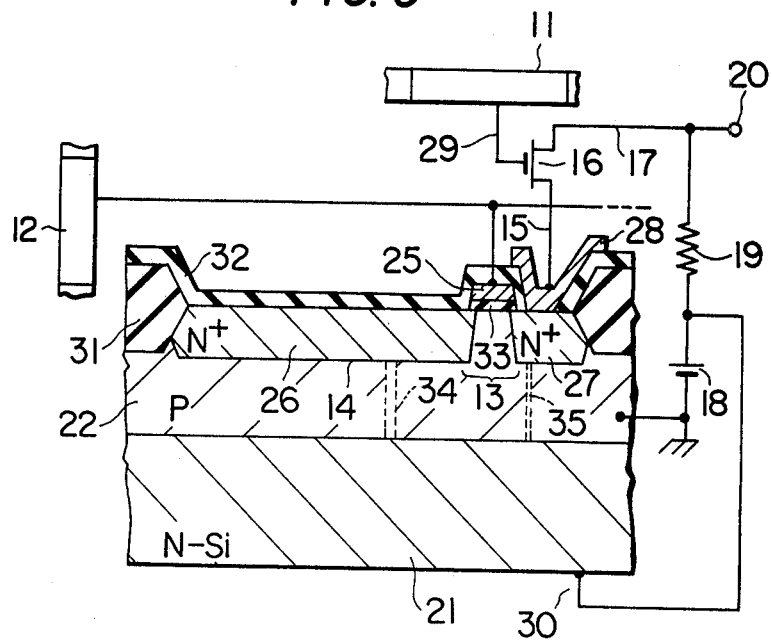
FIG. 3 is a diagram which illustrates a solid-state imaging device, i.e., which illustrates a picture element structure and a driving circuit according to an embodiment of the present invention.

FIG. 3 illustrates a method of driving the solid-state imaging device according to an embodiment of the present invention. FIG. 3 shows a cross-sectional structure of a picture element (photodiode and vertical switching MOST) of the solid-state imaging device, as well as a circuit for driving the picture element.

A substrate 21 is an N-type silicon substrate having an impurity concentration of $5 \times 10^{14}$ atoms/$cm^3$. A P-type well 22 on the surface of the substrate has an impurity concentration of $5 \times 10^{15}$ atoms/$cm^3$, and is formed by the diffusion, ion-implantation, epitaxial growth or the like. N+-type regions 26, 27 provided in the P-type well 22 have impurity concentrations of up to $10^{20}$ atoms/$cm^3$, and are formed by the diffusion or ion-implantation. A gate electrode 25 of MOST 13 is composed of plycrystalline silicon, and an interconnection electrode 28 which serves as a vertical signal output line is made of aluminum. An insulating film 31 is made of an $SiO_2$ film of a thickness of 1 μm, an insulating film 32 is made of an $SiO_2$ film of a thickness of 0.5 μm, and a gate insulating film 33 of MOST 13 is made of an $SiO_2$ film of a thickness of 0.1 μm.

Figure 1:
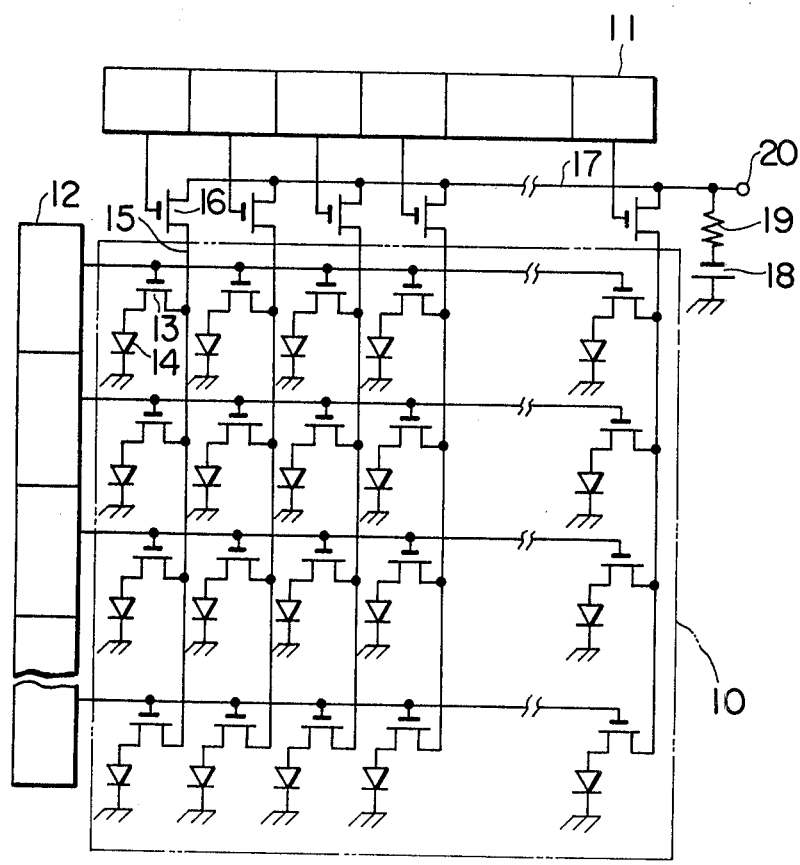
FIG. 1 is a circuit diagram schematically illustrating a solid-state imaging device.
Figure 2:
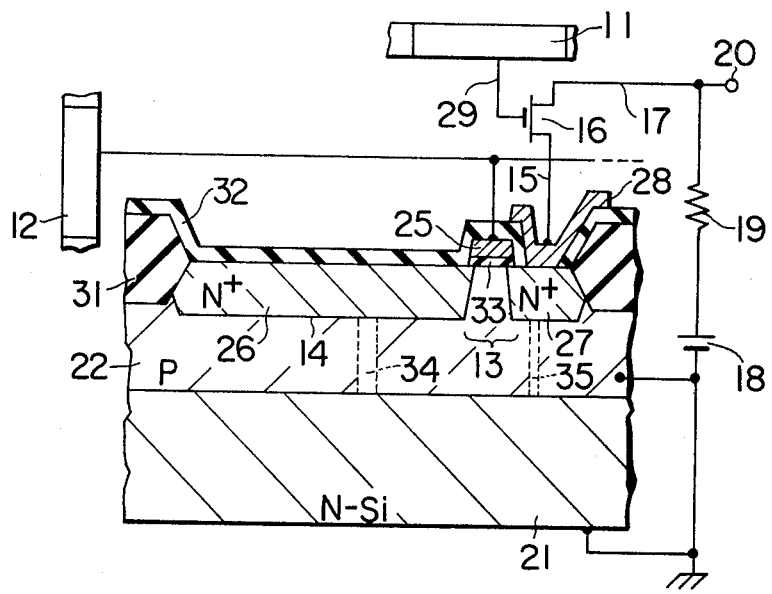
FIG. 2 is a diagram which illustrates a conventional solid-state imaging device, i.e., which illustrates a picture element in cross section and a conventional driving circuit.

Reference numeral 30 denotes a terminal for applying substrate bias, which is connected to a voltage source 18 for video output (of a voltage of, for instance, +5 volts) (other reference numerals denote the same members as those of FIGS. 1 and 2). (i) When the N+-type region 26 of the photodiode is short-circuited to the N-type substrate 21.

The N+-type region 26 of the photodiode remains in a floating state over a one-frame period (up to 30 msec) until it is subjected to the next scanning. Therefore, the N+-type region 26 of the photodiode acquires the same potential as that of the substrate through a non-diffused region 34 irrespective of the presence of incident light. With the substrate being biased to a voltage (for example, 0 volt as in the conventional example) which is smaller than the video voltage, when the MOST's 13 and 16 are turned on by the scanning, a charging current flows from the voltage supply for video output to the N+-type region 26 of the photodiode just like the case when the light is incident to reduce the potential difference $(V_V - V_{SUB})$; the result is the appearance of white spots. When the substrate voltage is set to be equal to the video voltage as done by the present invention, the potential difference becomes zero between the substrate and the region 26 of the photodiode. Unnecessary charging current does not flow except that corresponding to the discharge of the photodiode caused by the incident light. This is the state equal to that when no light is incident; the resulting black spots are less visible by the eyes. Conversely, when the substrate is biased with a voltage greater than the video voltage, a current flows in the direction opposite to that when the substrate is biased with a voltage smaller than the video voltage. There develop intense black spots. (ii) When the N+-type drain 27 for producing vertical signals is short-circuited to the substrate 21.

The drain 27 connected to the signal output line 15 remains in a floated state during one horizontal scanning period (up to 64 msec). When the potential of the substrate 21 is smaller than the video voltage, the signal output line during that period acquires the same potential as that of the substrate through the non-diffused region 35. Therefore, a charging current flows into the signal output line irrespective of the presence of the incident light upon the photodiode. Further, since the current flows for each horizontal scanning period, there appear white vertical lines. When the potential of the substrate is greater than the video voltage, there takes place a phenomenon opposite to that of the above-mentioned one. Namely, the charging current flows in the opposite direction giving rise to the development of black vertical lines. When the video voltage is applied to the substrate as done by the present invention, the potential difference becomes zero between the substrate 21 and the drain 27 connected to the vertical signal output line; the drain 27 is maintained at the video voltage. Namely, the state is the same as when no non-diffused region 35 is present. Therefore, the charging current does not flow unnecessarily except the current corresponding to that discharged by the optical signal of the photodiode. In other words, there develops no white or black vertical line.

Even when the video voltage is applied to the substrate 21 as done by the present invention, the electric current which flows through the substrate is usually of the order of several nanoamperes, or of the degree of signal current (one microampere or smaller) at the greatest. No current capacity is required, and no voltage source for substrate bias is needed, either; the voltage source for video output used for reading the signals is used for biasing the substrate.

As mentioned in the foregoing with reference to the embodiment, by applying a video voltage for reading signals to the substrate as done by the present invention, it is possible to eliminate the development of white spots or white and black vertical lines that are offensive to look at, thereby to strikingly improve the quality of the image. Thus, the present invention presents extremely high practical values.

The above embodiment has dealt with the MOS-type imaging device consisting of photodiodes and insulated-gate field effect transistors. The invention, however, can of course be applied to the CID (charge injection devices) and to the CCD (charge coupled devices) within a range which does not depart from the scope of the invention.

Further, although the embodiment was illustrated in the foregoing utilizing the N-channel insulated-gate field effect transistors, the present invention can also be put into practice employing the P-channel insulated-gate field effect transistors.

What is claimed is:

1. In a solid-state imaging device employing, as photoelectric conversion elements, photodiodes each of which consisting of a semiconductor substrate of a first conductivity type, a well region of a second conductivity type formed in the main surface of said semiconductor substrate, and an inpurity region of the first conductivity type formed in said well region, the improvement characterized by applying a voltage for driving said photodiodes to the potential of said semiconductor substrate.

2. A solid-state imaging device according to claim 1, wherein said photodiodes are arrayed in a plurality of members in said well region, switching elements which will be turned on and off by scanning circuits are connected to said photodiodes, and a driving voltage is applied to said photodiodes via said switching elements.

3. A solid-state imaging device according to claim 2, wherein said switching elements are insulated-gate field effect transistors.

4. A solid-state imaging device according to claim 3, wherein said insulated-gate field effect transistor consists of a source region which is said impurity region of the first type of conductivity, a drain region of the first conductivity type provided in said well region separated from said source region, and a gate electrode provided, via an insulating film, on the surface of the substrate between said source and said drain.

5. A solid-state imaging device comprising a semiconductor substrate of a first conductivity type having a major surface region, a plurality of photoelectric conversion elements, vertical switching elements and horizontal switching elements for addressing said plurality of photoelectric conversion elements, vertical and horizontal scanning circuits for turning on said vertical switching elements and horizontal switching elements one by one, respectively, and means for supplying a video voltage to said photoelectric conversion elements through a resistance element, said video voltage being successively impressed on said photoelectric elements through the scanning of said vertical switching elements and horizontal switching elements, characterized in that said photoelectric conversion elements are provided in a surface region of a second conductivity type disposed in said main surface region, and that said video voltage is impressed on said semiconductor substrate.

6. A solid-state imaging device according to claim 1, wherein said vertical switching element consists of an insulated-gate field effect transistor disposed in said surface region, and said photoelectric conversion element consists of a pn-junction photodiode constituted with one of a source region and a drain region of said first conductivity type of said insulated-gate field effect transistor and said surface region.

* * * * *